US011994447B1

United States Patent
Chigullapalli et al.

(10) Patent No.: US 11,994,447 B1
(45) Date of Patent: May 28, 2024

(54) LEAK DETECTION AND MANAGEMENT SYSTEM FOR RACK COOLING SYSTEMS

(71) Applicant: ZT Group Int'l, Inc., Secaucus, NJ (US)

(72) Inventors: Sruti Chigullapalli, Seattle, WA (US); Lauren Ficek, Lyndhurst, NJ (US); Karan Mehta, Garfield, NJ (US)

(73) Assignee: ZT Group Int'l, Inc., Secaucus, NJ (US)

(*) Notice: Subject to any disclaimer, the term of this patent is extended or adjusted under 35 U.S.C. 154(b) by 0 days.

(21) Appl. No.: 17/376,551

(22) Filed: Jul. 15, 2021

(51) Int. Cl.
*G01M 3/16* (2006.01)
*G01M 3/18* (2006.01)
*H05K 7/20* (2006.01)

(52) U.S. Cl.
CPC ............ *G01M 3/165* (2013.01); *G01M 3/183* (2013.01); *H05K 7/20781* (2013.01)

(58) Field of Classification Search
CPC .................... G01M 3/16–18; G01M 3/183
See application file for complete search history.

(56) References Cited

U.S. PATENT DOCUMENTS

| 10,638,645 | B1* | 4/2020 | Moen ................ G21C 15/182 |
| 2014/0251583 | A1* | 9/2014 | Eriksen ............ H05K 7/20772 165/104.33 |
| 2015/0131228 | A1* | 5/2015 | Ishikawa ........... H05K 7/20827 361/699 |
| 2016/0178475 | A1* | 6/2016 | Krishnan .......... H05K 7/20772 324/713 |
| 2016/0284193 | A1* | 9/2016 | Davis ................. G08B 21/18 |
| 2018/0067012 | A1* | 3/2018 | Franz ................... G01M 3/04 |
| 2020/0340767 | A1* | 10/2020 | Holden ............ H05K 7/20272 |
| 2020/0378858 | A1* | 12/2020 | Curtis .................... F17D 5/06 |
| 2022/0196507 | A1* | 6/2022 | Subrahmanyam ..... G01M 3/04 |

* cited by examiner

*Primary Examiner* — Alexander A Mercado
(74) *Attorney, Agent, or Firm* — Dergosits & Noah LLP; Todd A. Noah

(57) ABSTRACT

An apparatus and system are provided for detecting coolant leaks from connections to rack-mounted devices and managing the leak by directing liquid away from sensitive electrical components. On each device, a pan is connected to liquid couplings found on the rear of the device. A sensor tape is attached to a vertical section of the rack, e.g., on the coolant supply lines or housing. The pan collects leakage from the couplings and directs the leakage to the sensor tape, which is connected to a control unit. Upon liquid contacting the sensor tape, the control unit signals the detection of a leak. To prevent false positives due to incidental leakage, e.g., mere drops leaked upon connection to the coolant system, the pan may include a texture in the pan surface that retains a small amount of fluid.

20 Claims, 4 Drawing Sheets

LEAK DETECTION AND MANAGEMENT SYSTEM FOR RACK COOLING SYSTEMS

BACKGROUND

Typically, to cool individual nodes in a rack environment, e.g., an individual server, each node employs the use of a quick disconnect (QD) coupling that connects the cooling system to the individual device so that coolant may flow from the system to the device and return. However, when such QDs leak, the coolant, which is typically 25% propylene glycol, has the potential to cause issues. For example, the leak may infiltrate and damage the nearest device. The leak may also damage a device below. Additionally, the leak may simply promote corrosion of the rack or device chassis if not detected and managed efficiently. And a catastrophic leak amounting to a system failure may result in the device overheating.

Furthermore, the act of connecting or disconnecting a QD can result in a few incidental drops of coolant. Such incidental drops are not typically a concern. However, a leak detection system that cannot differentiate between a volume of leaked liquid that is of concern and a volume that is not of concern will result in false positives.

Thus, there is a need for a leak detection system that prevents false positives due to incidental leakage. provides a warning when a potentially damaging leak is detected, and manages such leaks to reduce their impact.

BRIEF DESCRIPTION OF THE DRAWINGS

The embodiments are illustrated by way of example and not limitation in the accompanying drawings, in which like references indicate similar elements, and in which.

DETAILED DESCRIPTION

Embodiments described within disclose a leak detection system that may be fitted to a rack equipped with a liquid-cooling system and to devices within the rack. Such embodiments are external to the chassis being cooled and do not require modifications of the chassis. In embodiments, a pan is provided below the coupling between the cooling system and the individual device to catch any leakage from the coupling. The pan may direct the liquid away from the server it is attached to, which also prevents dripping on any servers below. The pan may also include a mouth through which liquid may flow onto a sensor tape, which is in communication with a control unit. In the embodiment, when fluid contacts the sensor tape, the control unit interprets the resulting signal as indicating a leak and provides an alert.

In an embodiment, to reduce false positives, the pan may be dimensioned so that the leak must exceed a pre-determined volume before it is sufficient to flow through the mouth. For example, a dam may be placed in the flow path to the mouth that retains the pre-determined volume such that additional leakage is necessary before liquid may overwhelm the dam and flow through the mouth onto the sensor tape.

In an embodiment, the sensor tape may be positioned some distance from the coupling, with the pan including a flume or channel that extends the mouth toward the sensor tape. In such an embodiment, leakage is further directed away from the devices within the rack.

In an embodiment, leakage may be managed by a number of aspects of the system, including: being caught by the pan, being retained in the pan by a texture on the pan surface, being directed by the texture and/or pan to the rear of the rack, being further diverted to the rear of the rack by a flume extending from the pan to the sensor tape, and being given a flow path down the sensor tape that reduces potential splashing onto racked devices.

Figure 1:
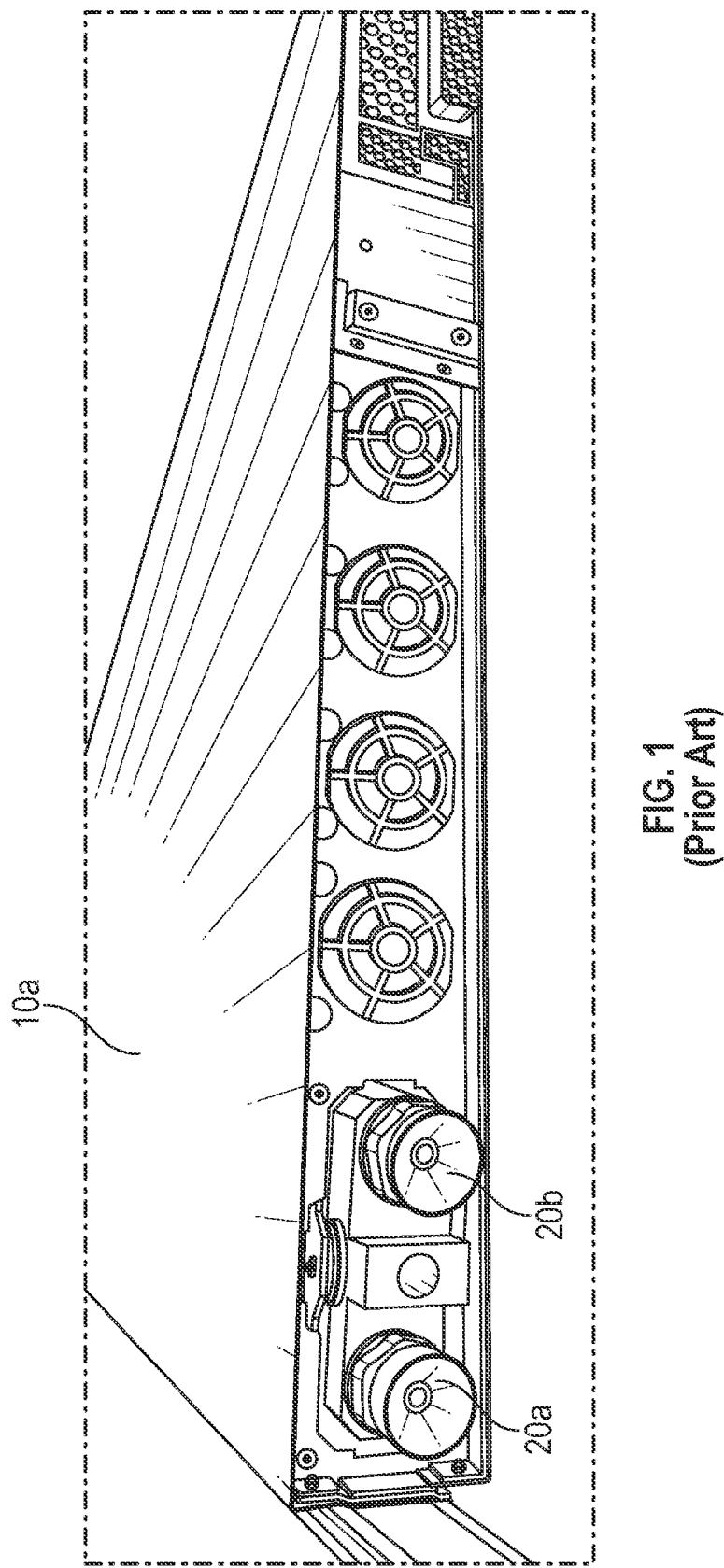
FIG. 1 is a rear isometric view illustrating a prior art device with couplings for liquid cooling.

FIG. 1 is a rear isometric view illustrating a prior art device 10 with couplings 20a, 20b for attaching to a liquid-cooling system. Couplings 20a, 20b are typically quick couplings facilitating the quick connection of device 10 to a source of coolant 30 (FIG. 4), with flow entering coupling 20a and returning from coupling 20b (or vice versa). Either or both coupling 20a, 20b may leak. Depending on the volume and location, such leaks may be incidental or potentially damaging. Also, there are potential leak vectors that may result in the leak getting into device 10 or a device in a rack slot below. While FIG. 1 shows a single device 10, in an actual rack system multiple such devices 10 will be disposed in a rack, one immediately above the other, and each with couplings identical to couplings 20a, 20b. Thus, an exemplary populated rack system will include a vertical row of identical couplings connected to a vertical liquid-cooling system, each coupling in the system with the potential to leak onto the device it is connected to and onto the devices below.

Figure 2:
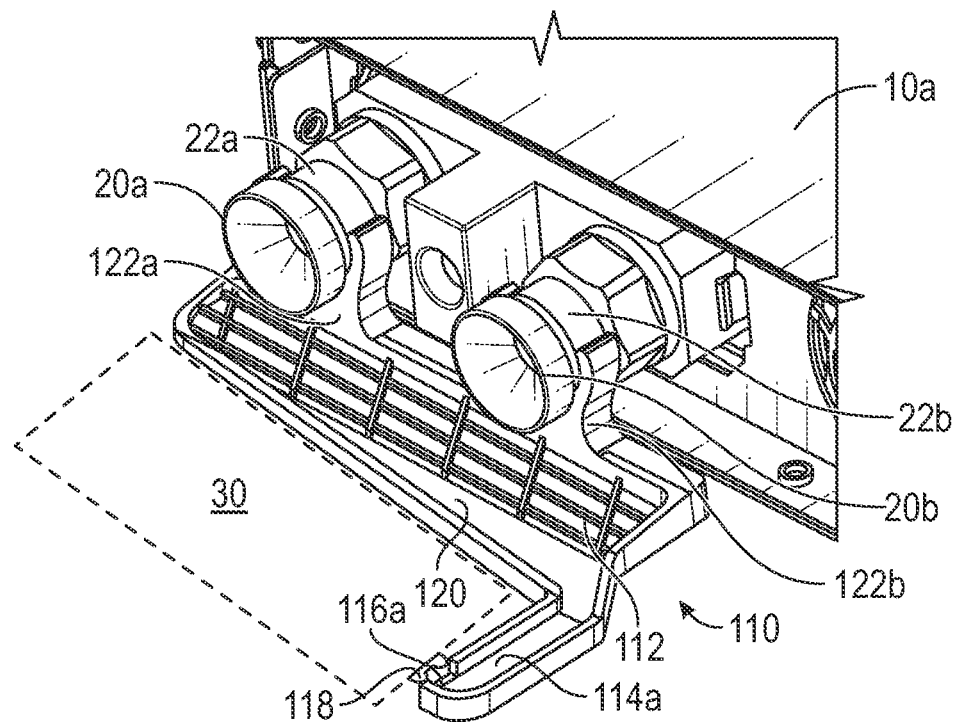
FIG. 2 is an upper right rear isometric view illustrating aspects of an embodiment of a leak detection system.
Figure 5:
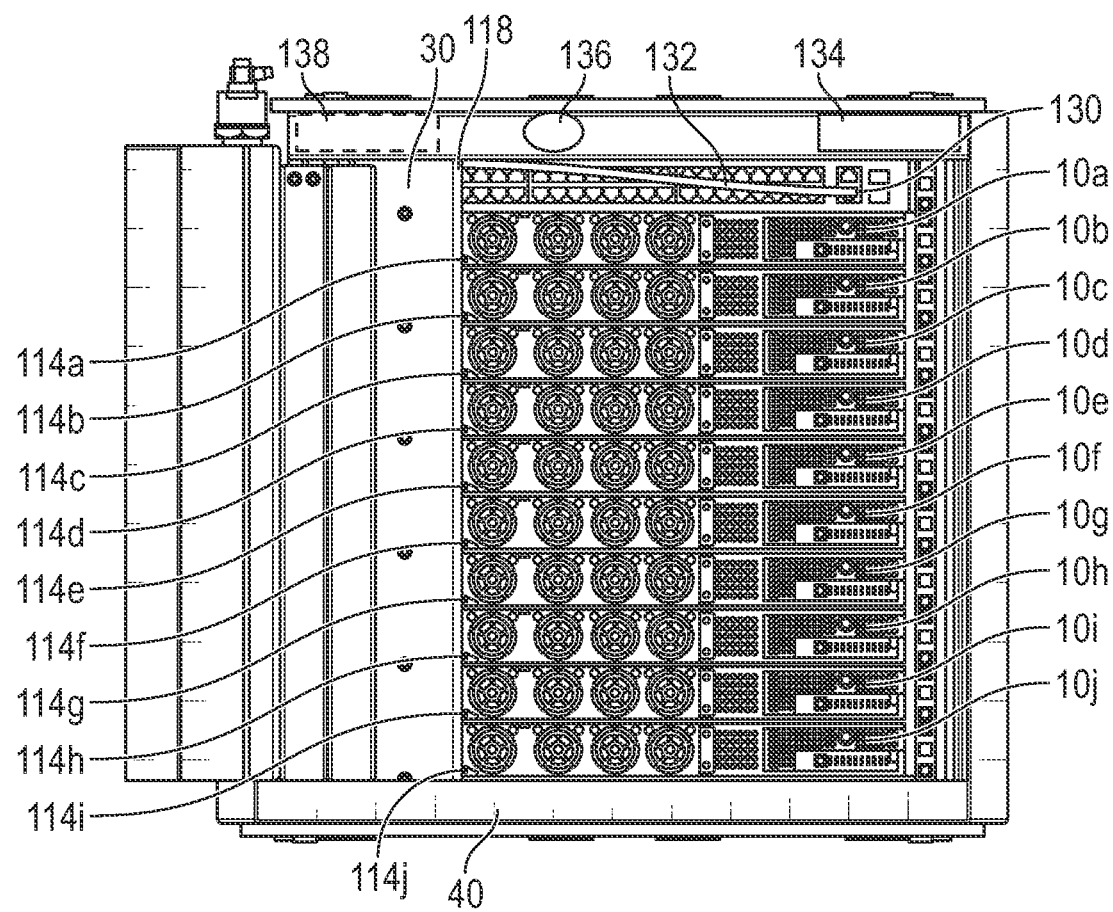
FIG. 5 is a rear view illustrating aspects of an embodiment of a leak detection system.

FIG. 2 is an upper right rear isometric view illustrating aspects of an embodiment of a leak detection system 100 (FIG. 5.) In FIG. 2, leak detection system 100 includes a pan 110. Pan 110 includes a connection to device 10, which as shown includes two snap fits 122a, 122b. Snap fits 122a, 122b are connected to quick couplings 20a, 20b, respectively, and dimensioned to grip flats 22a, 22b of couplings 20a, 20b. Snap fits 122a, 122b thus position pan 110 directly below where couplings 20a, 20b are mostly likely to drip. Furthermore, with each device in a populated rack system having a pair of couplings identical to 20a, 20b, a pan 110 may be affixed to each device in the rack system.

FIG. 2 indicates a dashed box 30, which indicates the location of a vertical section of coolant supply lines that supply coolant to or receive coolant from couplings 20a, 20b. A tee from section 30 toward each of couplings 20a, 20b is fitting with a mating coupling (see FIG. 4). The seal between the two mating couplings is therefore directly over pan 110. Pan 110 is also shown to occupy the majority of the gap between device 10 and vertical section 30, which enhances the ability of pan 110 to collect leakage.

In embodiments, pan 110 may include a texture 112, an overflow plain 120, a flume 114, and a mouth 116. Leak detection system 100 further includes a sensor tape 118 connected to a controller 130 (FIG. 5). As shown, texture 112 includes a plurality of retaining spaces between raised dam sections, with each space with the ability to retain liquid. In other embodiments, a single raised dam section may be employed. In an embodiment, texture 112 may include one or more undulations in pan 110, each undulation retaining liquid. With such embodiments, liquid leaked from couplings 20a, 20b will be retained by texture 112 until sufficient liquid has accumulated that is sufficient to overwhelm the last texture element before an overflow plain 120. Thus, texture 112 will collect incidental drops, e.g., from the connecting or disconnecting of couplings 20a, 20b, without allowing them to flow into overflow plain 120.

However, should couplings 20a, 20b develop a sustained leak, the leakage will fill and overwhelm one or more spaces of texture 112 and fluid will flow into overflow plain 120, through flume 114, out mouth 116, and onto sensor tape 118. Contact with the liquid will cause the output of sensor tape 118 to change, which will cause control unit 130 to create an alert indicating the detection of a leak.

The embodiment of FIG. 2 accomplishes the objectives. False positives are addressed by texture 112 retaining incidental leakage and preventing it from being detected. Sustained leakage is directed by pan 110 away from device 10 (and similar lower devices) via overflow plain 120 and flume 114 through mouth 116. Upon exiting mouth 116 the leakage is both detected by sensor tape 118 and control unit 130 and allowed to escape down sensor tape 118 to a drain or other receptacle (not shown) below the rack system.

In embodiments, sensor tape 118 may be located elsewhere, e.g., on different faces of vertical section 30 or directly on rack 40, with the geometry of pan 110 adapted to place mouth 116 against the sensor tape.

Figure 3:
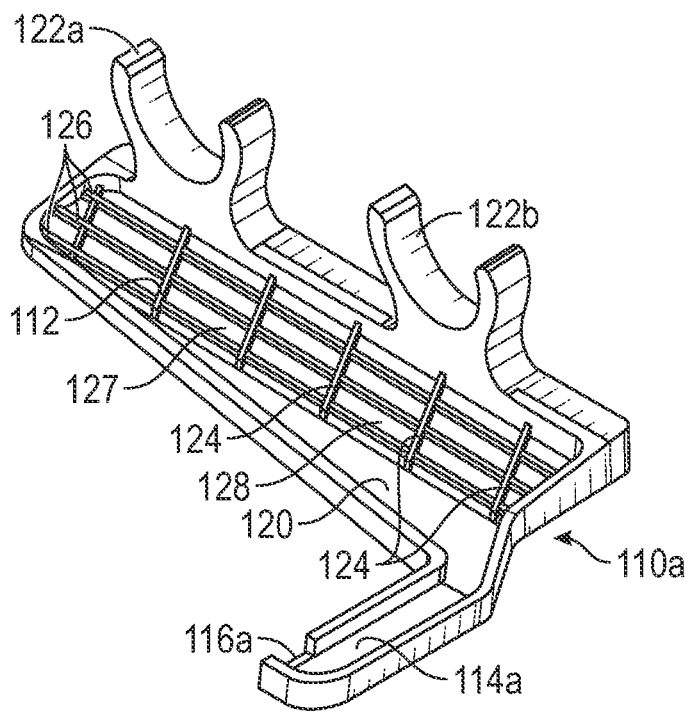
FIG. 3 is an upper right rear isometric view illustrating aspects of an embodiment of a leak detection system.

FIG. 3 is an upper right rear isometric view illustrating aspects of pan 110 of leak detection system 100. FIG. 3 illustrates that snap fits 122a, 122b may be used to quickly attach pan 110 to any server provided with couplings similar to 20a, 20b. In an embodiment, other connector arrangements are envisioned, e.g., a connector may attach pan 110 to a flange of chassis 10. Similarly, a connector may attach pan 110 to vertical section 30, which would ensure proper placement of mouth 116 with respect to sensor tape 118. A common feature of such connectors is that they orient pan 110 below connections 20a, 20b and mouth 116 against sensor tape 118. Another feature is that connections 122a, 122b do not depend on the chassis 10, but on the couplings 20a, 20b.

FIG. 3 illustrates that, in the embodiment, texture 112 includes flow-influencing dams 124 and flow-inhibiting dams 126 between dams 124. Flow-influencing dams 124 guide fluid toward overflow plain 120. Flow-inhibiting dams 126 retain a certain amount of fluid before being overwhelmed. A feature of the embodiment of texture 112 is that random drips may fall in different areas of texture 126 and not pool together. Thus, e.g., a section 127 may retain an amount of incidental leakage and a section 128 may retain an additional amount of leakage.

Figure 4:
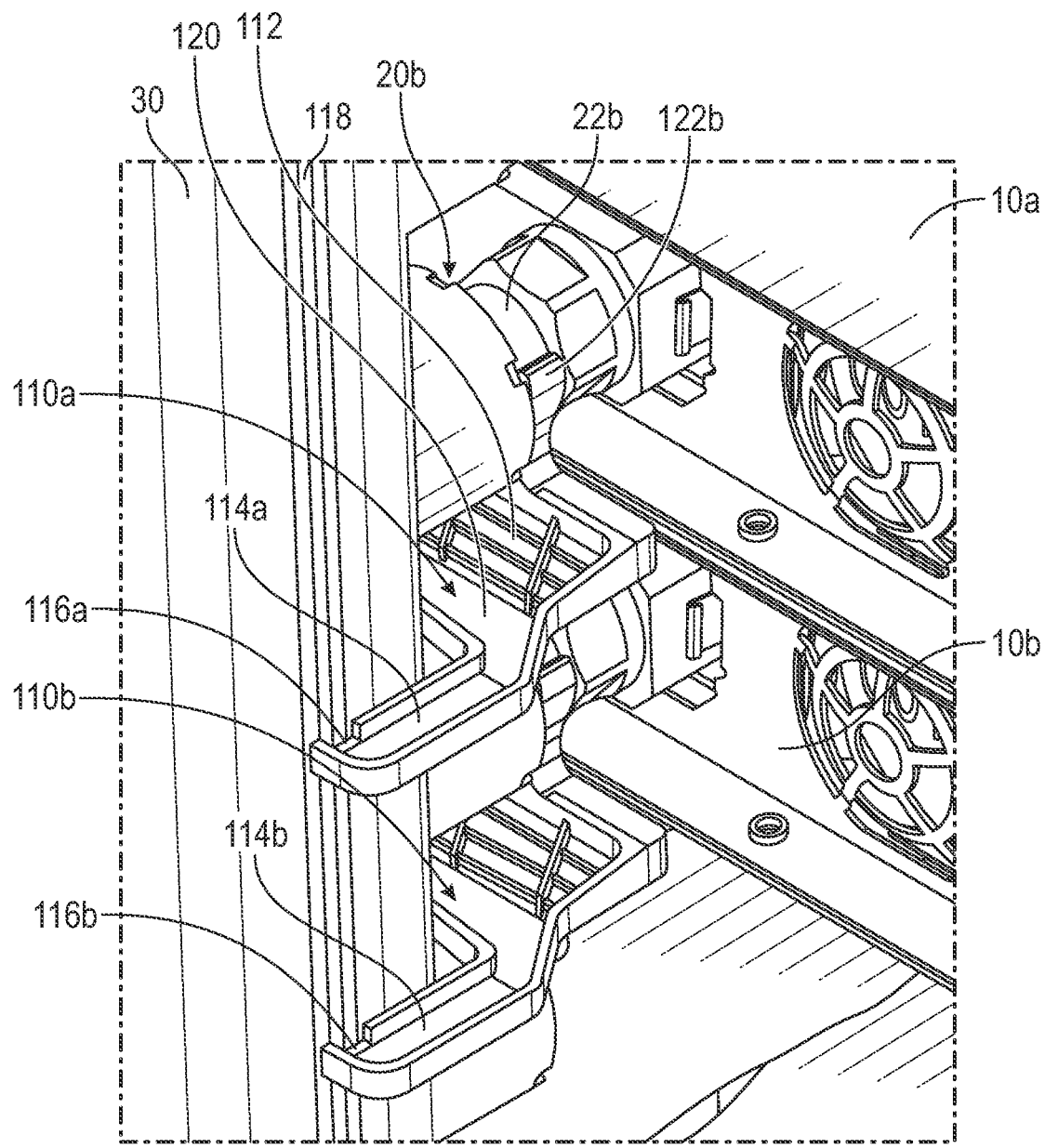
FIG. 4 is an upper right rear isometric view illustrating aspects of an embodiment of a leak detection system.

FIG. 4 is an upper right rear isometric view illustrating aspects of lead detection system 100. In FIG. 4, cooling system vertical section 30 is shown connected to coupling 20b, with snap fit 122b about flat 22b. A chassis 10a, identical to chassis 10, is disposed in rack 40 and connected to cooling system vertical section 30. Chassis 10a is provided with a pan 110a with a mouth 116a positioned against sensor tape 118. FIG. 4 thus illustrates that a plurality of chassis may be monitored for leakage using one sensor tape 118 and controller 130, each chassis fitted with an identical pan 110. However, should chassis 10a be different from chassis 10, so long as chassis 10a has connectors similar to connectors 20a, 20b in configuration and location, pan 110a will function with chassis 10a as well as with chassis 10.

FIG. 5 is a rear view illustrating aspects of an embodiment of leak detection system 100. In FIG. 5, rack 40 is filled with chassis 10a . . . 10j, each connected to cooling system vertical section 30 and provided with a pan 110a . . . 110j (as indicated by the presence of flumes 114a . . . 114j). Control unit 130 is shown connected to sensor tape 118 via a sensor lead 132. In embodiments, control unit 130 may indicate a leak in a variety of ways, including, e.g., a visual indicator 134 such as a light, an audio indicator 136 such as an alarm. In embodiments, control unit 130 may be provided with a network interface 138 providing a network connection via, e.g., Wi-Fi or Bluetooth™, and send alerts via the network.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
a first pan configured to be removably connected by a first connector to a liquid-cooled device mounted in a server rack, the first pan having an inside bottom surface, vertically oriented walls extending from the inside bottom surface and an opening in one of the vertically oriented walls to provide a first flow path for liquid to continuously drain out of the first pan onto a sensor secured to the outside of the first pan adjacent the opening.

2. The apparatus of claim 1, further including a dam disposed in the pan between the opening and first connector and configured to prevent a second volume of liquid from reaching the opening.

3. The system of claim 1, further including a texture applied to the pan and configured to collect a third volume of liquid.

4. The system of claim 3, wherein the texture includes a dam configured to retain part of the third volume of liquid.

5. A system comprising:
a first pan configured to be removably connected by a first connector to a first liquid-cooled device mounted in a rack, the first pan having an inside bottom surface, vertically oriented walls extending from the inside bottom surface and a first opening in one of the vertically oriented walls to provide a first flow path for liquid to continuously drain out of the first pan and onto a sensor tape electrically coupled to a control unit, the sensor tape being positioned outside of the first pan adjacent the first opening such that when the first pan is connected to the first liquid cooled device, the sensor tape transmits a first leak detection signal to the control unit in response to liquid draining out of the first pan through the first opening onto the sensor tape.

6. The system of claim 5 further including a dam disposed in the first pan between the first opening and the first connector.

7. The system of claim 5 further including a plurality of dams disposed in the first pan.

8. The system of claim 5 further including a texture applied to the first pan and configured to collect a first volume of liquid.

9. The system of claim 8, wherein the texture includes a first dam configured to retain the first volume of liquid.

10. The system of claim 5, wherein the first connector is dimensioned to connect to an element of a liquid-cooling system such that the first pan is positioned to receive liquid dripping from the element of the liquid-cooling system.

11. The system of claim 10, wherein the element includes a coupling and the first connector includes a snap fit dimensioned to connect to the coupling.

12. The system of claim 10, wherein the first pan is dimensioned to span a gap between the first liquid-cooled device and a vertical section of the liquid-cooling system.

13. The system of claim 12, wherein the sensor tape is attached to the vertical section.

14. The system of claim 13, wherein the first pan further includes a flume extending the first opening toward the sensor tape.

15. The system of claim 5, wherein:

the first connector is dimensioned to connect to a first element of a liquid-cooling system such that the first pan is positioned to receive liquid dripping from the first element and the second connector is configured identically to the first connector to connect to a second element of the liquid-cooling system such that the second pan is positioned to receive liquid dripping from the second element.

16. The system of claim 15, wherein:

the first element includes a first coupling and the first connector includes a first snap fit dimensioned to connect to the first coupling, and the second element includes a second coupling and the second connector includes a second snap fit dimensioned to connect to the second coupling.

17. The system of claim 5 further including:

a second pan configured to be removably connected by a second connector to a second liquid-cooled device mounted in the rack, the second pan having an inside bottom surface, vertically oriented walls extending from the inside bottom surface and a second opening in one of the vertically oriented walls to provide a second flow path for liquid to continuously drain out of the second pan and onto the sensor tape such that when the second pan is connected to the second liquid cooled device, the sensor tape transmits a second leak detection signal to the control unit in response to liquid draining out of the second pan through the second opening onto the sensor tape.

18. The system of claim 17, wherein the first pan is dimensioned to span a gap between the first liquid-cooled device and a vertical section of the liquid-cooling system and the second pan is identical to the first pan.

19. The system of claim 18, wherein the sensor tape is attached to the vertical section.

20. The system of claim 19, wherein:

the first pan further includes a first flume extending the first opening toward the sensor tape, and the second pan further includes a second flume extending the second opening toward the sensor tape.

* * * * *